United States Patent [19]

Feldstein

[11] Patent Number: 4,818,953

[45] Date of Patent: Apr. 4, 1989

[54] OSCILLATOR IMPROVEMENT

[75] Inventor: Robert S. Feldstein, Pelham Manor, N.Y.

[73] Assignee: Genlyte Group, Inc., Secaucus, N.J.

[21] Appl. No.: 178,565

[22] Filed: Apr. 7, 1988

[51] Int. Cl.[4] .............................................. H03K 3/30
[52] U.S. Cl. ................................... 331/114; 331/112; 331/113 A; 331/146; 331/151; 363/133
[58] Field of Search ................... 331/111, 112, 113 R, 331/113 A, 114, 143, 144, 146, 148, 151; 363/22, 23, 24, 25, 131, 133, 134

[56] References Cited

U.S. PATENT DOCUMENTS

4,149,234 4/1979 Smith .............................. 331/114 X

*Primary Examiner*—Eugene R. LaRoche
*Assistant Examiner*—David Mis
*Attorney, Agent, or Firm*—Cohen, Pontani & Lieberman

[57] ABSTRACT

An improved oscillator circuit for avoiding core saturation without the need for auxiliary magnetic devices employs an emitter resistance for regulating base voltage, and a semiconductor base shunt for initiating transistor cut-off when the base voltage increases above the threshold voltage of the semiconductor shunt, the emitter resistance being preselected to activate the base shunt before the transformer core reaches saturation.

27 Claims, 5 Drawing Sheets

OSCILLATOR IMPROVEMENT

BACKGROUND OF THE INVENTION

1. Field of the Invention

This invention pertains to oscillator circuits, and more particularly to self-excited oscillators.

2. Prior Art

Oscillator circuits typically employ one or more switching devices, as for example active semiconductor devices such as bipolar transistors, FETS, etc. Through a variety of possible arrangements, the semiconductor devices are alternately driven between increasing and decreasing conduction producing an oscillating output which is applied to a load, typically via the secondary winding of a transformer incorporated in the oscillator. One such configuration is the well known self-excited push-pull oscillator.

A principal problem with such circuits is transformer core saturation which, if left unchecked, can result in excess heating and reduced efficiency. Therefore, in a self-excited push-pull oscillator, an important design consideration is to effect reversal prior to core saturation. While the prior art has developed such schemes, they typically rely on one or more auxiliary magnetic devices, such as feedback transformers, driven to saturation for effecting reversal of the conductive states of the switching devices before saturation of the main transformer core occurs. This not only adds cost and complexity, but many such circuits suffer from a phenomenon known as "core walking". For example, in the case of a bipolar self-excited push-pull oscillator wherein the saturation voltage of the transistors is not identical, which is almost inevitably the case, with each succeeding cycle the collector current of one transistor will increase relative to the collector current of the other. Since core flux is proportional to current flow through the winding, the core flux will also increase, with each operating cycle, in the direction of the transistor with the higher collector current. Eventually, the core "walks" to saturation in the direction of that transistor.

It is accordingly an object of the present invention to provide a self-excited oscillator incorporating improved means for effecting reversal prior to core saturation.

It is a further object of the present invention to provide a self-excited push-pull oscillator wherein core walking is avoided.

It is another object of the present invention to provide a self-excited oscillator which avoids core saturation without the need for complex or costly circuit components, such as auxiliary magnetic devices.

SUMMARY OF THE INVENTION

The present invention is directed to an improved oscillator which avoids transformer core saturation without auxiliary magnetic devices.

The oscillator in accordance with the present invention comprises a transformer having a core and primary and secondary windings on the core and, typically but not necessarily, a feedback winding, the secondary winding being adapted for connection across the load to be driven whereby the signal produced in the secondary drives the load; a transistor having its base connected to one end of the feedback winding and its collector connected to one end of the primary winding, such that the transistor is alternately driven between saturation and cut-off for producing an oscillating current across the primary winding when the circuit is connected to the power source; a semiconductor junction device of the type accommodating current flow in only one direction upon the application of a predetermined threshold voltage, a semiconductor device being connected in parallel with the base-emitter junction of the transistor, such that current is shunted from the base through the semiconductor device for initiating cut-off of the transistor when the voltage at the base raises the voltage across the semiconductor device to the threshold voltage; and a first resistor means in series with the emitter of the transistor, the value of the first resistor means being preselected such that the increasing emitter current raises the base voltage sufficiently to shunt base current through the semiconductor device before the current flow through the transistor drives the transformer core to saturation.

As will be apparent from the following description, the oscillator circuit design of the present invention may be used in a variety of applications, including push-pull oscillators and flyback or feedforward circuits. When incorporated in a push-pull oscillator, and as will be apparent from the following description, the circuit of the present invention also avoids current imbalances that lead to core walking.

Further features and advantages of the present invention will be more fully apparent from the following detailed description and annexed drawings of the presently preferred embodiments thereof.

DETAILED DESCRIPTION OF THE PREFERRED EMBODIMENTS

Figure 1:
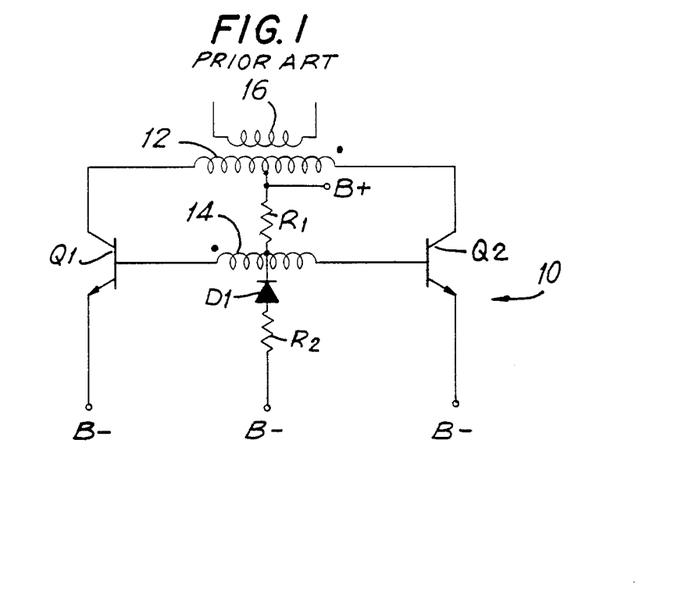
FIG. 1 is a simplified circuit diagram of a prior art push-pull oscillator circuit.

Referring initially to FIG. 1, a simplified prior art bipolar push-pull oscillator is generally designated at 10. While the operation of the circuit 10 will be apparent to those of ordinary skill in the art, a brief description thereof will provide a background for the description of the invention which follows.

The circuit shown in FIG. 1 is self-starting in that $R_1$ provides sufficient current to turn on the transistors $Q_1$ and $Q_2$. Even a slight imbalance between the transistors $Q_1$ and $Q_2$, which is almost inevitable, results in one transistor conducting slightly more than the other. So, for example, if initially $Q_1$ conducts more than $Q_2$, the transformer primary 12 exhibits a current imbalance on either side of the center tap B+, which in turn induces a small voltage difference in the feedback winding 14.

For the winding direction illustrated in FIG. 1, the induced voltage difference in the feedback winding 14 forward biases transistor $Q_1$, thereby increasing its emitter current $I_{E1}$, while simultaneously reducing the bias on $Q_2$ which, in turn, reduces $I_{E2}$. The effect is to rapidly cut-off $Q_2$ and drive $Q_1$ to saturation.

In the circuit 10, bias current for the transistor $Q_1$ is provided primarily by resistor $R_2$, with some contribution from $R_1$. If B+ is large compared to the maximum base to emitter voltage ($V_{BE}$ Max), as is the case, for example, when the circuit is line powered, the contribution to bias current from $R_1$ is negligible, thereby minimizing dissipation. Since, in a practical circuit, $R_2$ must be rather low to provide sufficient bias current, for any practical value of $R_1$, $R_1$ would not provide sufficient current to raise the voltage at the center tap of the feedback coil above the 0.5V transistor threshold. In line-powered units, therefore, the resistor $R_1$ must dissipate energy due to a 120 volt (RMS) impressed voltage and yet have a sufficiently low resistance to start oscillation shortly after zero crossing. Ideally, then, $I_{R1}$ should not flow through $R_2$. This is achieved by the isolation diode $D_1$, with the small forward drop across the diode being compensated for by an appropriate reduction in the value of $R_2$.

In operation, assuming the bias current $I_{B1}$ for the transistor $Q_1$ is sufficient to keep $Q_1$ saturated, the initial total current $I_T$ through $Q_1$ will be the reflected load current $I_{L(reflected)}$ plus the current through the half primary inductance between B+ and $Q_1$, i.e., $$I_T = I_L(\text{reflected}) + E/L(dt) \quad \text{(Equation 1)}$$

where $I_T$ is the total current through transistor $Q_1$, $I_{L(reflected)}$ is the reflected load current, E is the voltage drop across the half primary and L is the inductance of the half primary. As an approximation, L and E may be assumed constant over a half cycle, yielding:

$$I_T = I_{L(reflected)} + E/L \, dt \quad \text{(Equation 2)}$$

From Equation 2 it can be seen that $I_T$ rises linearly with time. In the transformer core, the flux is proportional to $N \times I_T$, i.e., the product of transformer coil turns end current, and therefore to $I_T$. Assuming for simplicity that, prior to saturation, inductance is independent of flux, then prior to core saturation $dI/dt$ is constant, as is $d\phi/dt$, the induced secondary and feedback voltages, the $Q_1$ bias current, and the $Q_2$ cut-off voltage.

At core saturation, the half primary inductance decreases abruptly and $dI_T/dt$ increases rapidly until the current reaches a value at which can no longer be supported by the available base current, whereupon $dI_T/dt$ falls. At that point, $d\phi/dt$ also drops, and with it bias voltage and current, which further reduces the current through the transistor $Q_1$. Eventually, $Q_1$ is cut-off and $Q_2$ saturates. The process repeats indefinitely producing an oscillating effect as each transistor is switched successively between cut-off and saturation.

In practical terms, the circuit of FIG. 1 is not viable since once core saturation is reached, the transistor currents are virtually uncontrolled. The bias resistor must be specified to ensure saturation in the lowest gain transistor, with a safety factor to ensure low saturation voltage and low dissipation. Therefore, the bias current is sufficient to keep a typical transistor conducting at many times the current at which the transformer core reaches saturation. Even if this does not result in transistor destruction, it causes excess heating as the current increase beyond core saturation is dissipated in the transistors instead of being delivered to the load. In practice, because transistor turn-off is not instantaneous, the situation is even worse. As $I_T$ falls, the collector voltage rises. This produces an EIT product, known as voltage/current crossover, which contributes substantially to heating. As $I_T$ at turn-off increases, voltage/current crossover increases rapidly since the turn-off time deteriorates with increasing current. The result may be that $Q_1$ is still conducting as $Q_2$ begins conducting. During this overlap, the two half primary currents produce opposite or cancelling flux, and the transformer inductance for the "buck" currents is near zero. The overlap spikes can be large, possibly destructive and adversely affect efficiency.

As the foregoing demonstrates, core saturation must be avoided in practical oscillator circuits and, as noted, a commonly practiced solution has heretofore been to employ auxiliary magnetic devices, such as additional power supply series coils and feedback transformers, which are driven to saturation before transformer core saturation occurs. This technique, known as auxiliary core switching, not only adds cost and complexity, but often results in "core walking".

Figure 2:
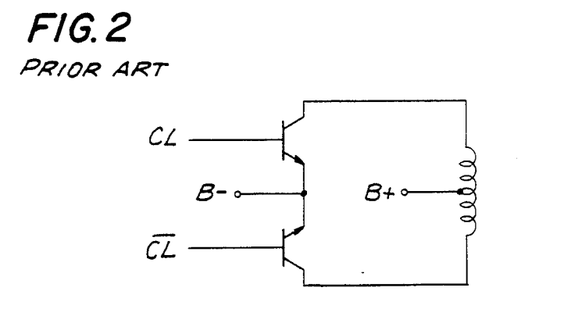
FIG. 2 is a simplified version of a prior art clock-driven push-pull output stage.

Core walking is best illustrated with reference to the prior art clock-driven push-pull output stage of FIG. 2. In FIG. 2, perfect transformer symmetry is assumed, as is perfect symmetry in the duration of the clock-driven half cycles. Also, overlap is neglected. Almost invariably, however, the saturation voltages ($V_{sat}$) of the two transistors $Q_1$, $Q_2$ are not identical. Consequently, even with identical half cycles and a fixed voltage B+, the voltage across the half primary between $Q_1$ and B+ will be at least slightly different than the voltage across the half primary between B+ and $Q_2$ when the respective transistors are conducting. Consequently, assuming this difference favors $Q_1$, the peak current for $Q_1$ will be slightly larger at reversal than the peak current through $Q_2$. Therefore, the flux $\phi$, which is proportional to $N \times I$ (number of coil turns times current), will be slightly larger in the direction of $Q_1$ than $Q_2$, such that at the end of each cycle $Q_2$ will not have completely cancelled the flux induced by $Q_1$. With each succeeding cycle, this contribution increases, and in fact increases exponentially, since inductance actually decreases as flux increases, thereby further increasing the current through $Q_1$ over $Q_2$. The core, then, will rapidly "walk" to saturation in the direction of $Q_1$ since $Q_1$ faces only the flux generated by $Q_2$ starting from saturation. The resulting core saturation has the by now familiar adverse consequences discussed above in connection with the circuit of FIG. 1.

While the concept of "core walking" has been described in connection with the clocked system of FIG. 2 for purposes of clarity, it will be apparent that it is also a problem in self-excited systems, where the effects of core walk and core saturation can be devastating. Nevertheless, low cost, high volume production virtually requires a self-excited or at least self-sustaining oscillator for achieving reduced size, low component count, simplicity, reliability, etc.

Figure 3:
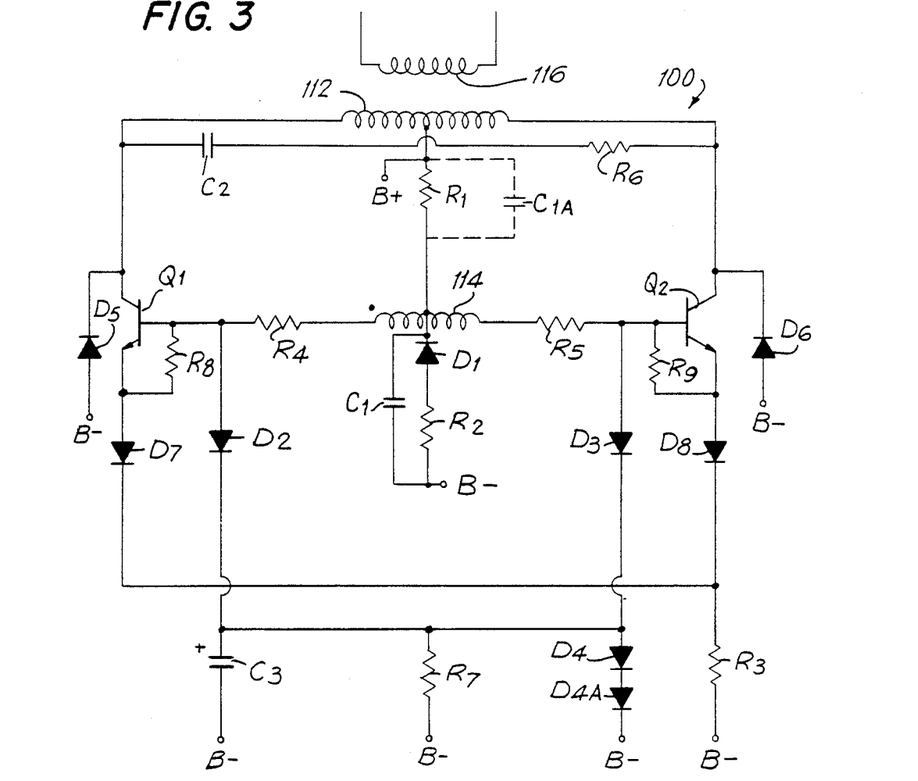
FIG. 3 is a preferred form of an improved self-excited push-pull oscillator circuit in accordance with the present invention.

Referring now to FIG. 3, a currently preferred embodiment of an improved self-excited push-pull oscillator 100 in accordance with the present invention is shown. As will be apparent from the following discussion, the circuit 100 provides a simple yet effective technique for avoiding core saturation and its attendant problems.

Looking initially at conduction through the transistor $Q_1$, if it is assumed that $Q_1$ is switched on following $Q_2$, substantial energy will already be stored in the transformer core. Switching off $Q_2$, then, will result in a rapid rise in the $Q_2$ collector voltage ($V_{Q2}$). At cut-off, the primary of the transformer acts as an autotransformer and as $V_{Q2}$ rises, $V_{Q1}$ falls. When $V_{Q2}$ reaches $2B+$, $V_{Q1}$ reaches zero, whereupon the auxiliary clamp diode $D_5$ holds $V_{Q1}$ at substantially zero until the core discharges both through the load and $D_5$.

Figure 4:
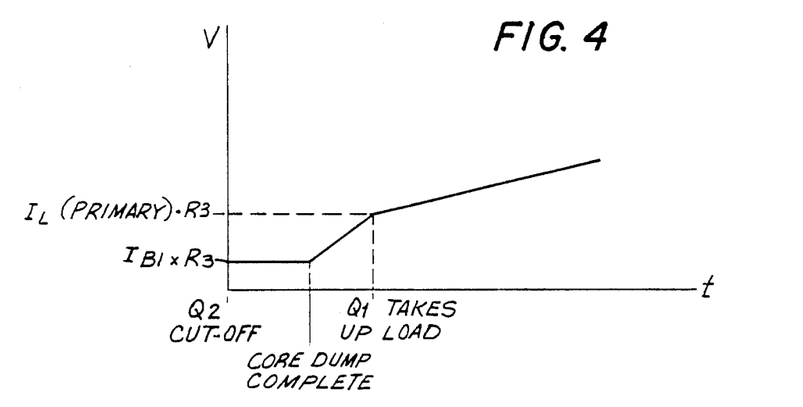
FIG. 4 is a graph illustrating the voltage drop across the resistor $R_3$ in FIG. 3.

Therefore, it will be apparent that the initial current through the emitter of transistor $Q_1$ will be substantially the base current $I_{B1}$. Once the core energy has been exhausted, i.e. core dump is complete, there is a smooth transition of the emitter current to the load current divided by the transformer turns ratio. Thereafter, the emitter current increases over time by the additional term $E\,dt/L$, where L is substantially constant as long as core flux does not approach saturation. As will be apparent from FIG. 3, the $Q_1$ emitter current flows through the resistor $R_3$, the voltage across $R_3$ being substantially as shown in FIG. 4.

Note that the current generated in the primary winding due to the term $E\,dt/L$ represents stored energy ($\frac{1}{2}LI^2$), where L equals the half primary inductance at any instant and $I^2$ results from the time varying current component, not the load current. It is this stored energy which effects voltage reversal at the primary when switchover occurs, and drives the clamp diode in parallel with the transistor about to be turned on, i.e. $D_5$ in the description above. As long as this reversal produces clamp diode conduction, there is a period during which neither transistor is conducting, and consequently no "overlap" current flows following reversal.

At the onset of reversal—e.g. $Q_2$ turning off, $Q_1$ turning on—care must be taken to prevent $Q_1$ from conducting while $Q_2$ is turning off since, typically, $T_S+T_F$ for transistors is longer than $T_D+T_R$ where $T_S$=storage time, $T_F$=full time, $T_D$=delay time and $T_R$=rise time. However, switchover separation is easily handled in the circuit of FIG. 3 as the feedback winding 114 can provide a substantial cut-off voltage to the transistor being cut off, typically $-5$ to $-9$ volts, while the transistor being turned on is biased by about $+2$ volts, i.e. $V_{BE}+V_{R3}$, where $V_{BE}$ is the base to emitter voltage and $V_{R3}$ is the voltage through $R_3$ at turn on. Consequently, a small voltage swing, only about 1 volt, is required to cut off the conducting transistor, whereas several times that amount is required to start conduction of the transistor being switched on. The center tap is generally negative during conduction. Accordingly, $C_1$ at the center tap ensures that the base of the on transistor is switched off and that the base of the off transistor remains negative until primary reversal is completed. For this purpose, $C_1$ is selected such that the time constant of $R_2$, $C_1$ is longer than the reversal time.

As indicated by the dotted lines in FIG. 3, capacitor $C_1$ may be replaced by capacitor $C_{1A}$ in parallel with resistor $R_1$. While the resulting capacitor is larger and more expensive, it couples the power supply ripple to the center tap of the feedback winding 114 for reducing conducted radio frequency interference. The use of the capacitor $C_{1A}$ is significant only as the line voltage approaches zero-crossing. Normally, in applications which require a high power factor the main power supply storage capacitor is small and, therefore, at zero-crossing, $B+$ becomes small and the overall loop gain decreases as the feedback voltage becomes insufficient to support normal oscillation. At low $B+$, the small offsets due to the voltage drops across the semiconductor junction devices become significant, and only weak linear high frequency oscillation occurs. The use of $C_{1A}$ biases the feedback winding to transistor cut-off since $B+$ is dropping and transistor input impedance becomes large as the bias voltage approaches the threshold voltage. The result is to stop oscillation entirely for a brief interval straddling line voltage zero-crossing, thereby removing the contribution to conducted radio frequency interference due to the weak oscillations normally occurring at this time. The contribution to load voltage normally made by this weak oscillation is negligible, but a small dissipation contribution is associated with it. It will therefore be apparent that the use of $C_{1A}$ in place of $C_1$ slightly raises efficiency. Preferably, $C_{1A}$ is a low dissipation filter capacitor for handling the rapid voltage changes to which it is subjected.

From the foregoing, it will be apparent that since the initial emitter current for the transistor about to be turned on is negligible, the potential difference between the base and $B-$ for that transistor is substantially $V_{BE}$. Since $V_{BE}$ is lower than the threshold voltage of $D_2$ and $D_4$ in series (assuming $Q_1$ is about to be turned on), $D_2$ and $D_4$ do not conduct.

As the oscillation half-cycle evolves, the emitter current $I_E$ rises, as does the voltage drop $V_{R3}$ across $R_3$. Consequently, the potential difference from the base of the transistor $Q_1$ to $B-$, which is equal to $V_{BE}$ plus $V_{R3}$, rises until $D_2$ and $D_4$ conduct. Once the diodes conduct, the base current declines rapidly thereby terminating the rise in collector current, which in turn reduces $dI/dt$ and, therefore, $d\phi/dt$. It will therefore be apparent that once the diodes $D_2$ and $D_4$ conduct, the feedback voltage which supported the base current declines, with the result that switchover is initiated by reaching a current limit set by the emitter resistor $R_3$, rather than by the core flux. Of course, the value of $R_3$ may be selected to determine the current at which the diodes $D_2$ and $D_4$ begin to conduct, and hence the current at which switchover occurs.

During the next half cycle, the transistor $Q_2$ is turned on in the same manner that $Q_1$ was turned on in the preceding description, and base current limiting is achieved for the transistor $Q_2$ by the diodes $D_3$ and $D_4$, again in conjunction with the emitter resistor $R_3$. While separate emitter resistors could be used for the transistors $Q_1$ and $Q_2$, the preferred use of a common emitter resistor eliminates one component and, more importantly, guarantees that the current sensor, i.e. the emitter resistor, is identical for alternate half cycles. For similar reasons, $D_4$ is common. $D_2$ and $D_3$ are separate, but should and will in practice be similar inasmuch as semiconductor junction threshold voltage is basically a material rather than construction characteristic. Therefore, for two diodes from the same manufacturing lot, the differences tend to be trivial. Similarly, the base to emitter voltages for the transistors $Q_1$ and $Q_2$ tend to be sufficiently close for practical purposes.

It will be apparent that core walk is not a problem in the circuit of FIG. 3, since below saturation inductance is weakly reduced by the flux density. Consequently, the core direction more strongly magnetized will simply permit a greater $dI/dt$ and reach its current limit more quickly at the same MMF Magneto-Motive Force) as the opposite core direction. Consequently, any flux imbalance will generate a compensating timing imbalance, thereby preventing the escalating core imbalances which are the basis for core walk.

Still referring to FIG. 3, $R_4$ and $R_5$ are included to accommodate higher feedback voltages which produce higher dV/dt at turn-off, thereby reducing transistor heating. For example, if $Q_1$ is conducting and $R_2$, $R_4$ and $R_5$ are equal, the base current $I_{B1}$ at the transistor $Q_1$ flows through $R_2$ and $R_4$. Consequently, the end of the feedback winding 114 in series with $R_4$ is positive by the sum of the base to emitter voltage of the transistor $Q_1$ ($V_{BE}$), the voltage drop across the resistor $R_3$ ($V_{R3}$), and the voltage drop across the resistor $R_4$ (equal to $I_{B1} \times R_4$). The center tap of the feedback winding is negative by the product of the base current $I_{B1}$ and the resistor $R_2$, neglecting the base voltage ($V_B$) for the sake of simplicity. Consequently, the center tap is only half as negative as it would be if the resistance of $R_2$ were doubled and used alone, i.e. without $R_4$ and $R_5$. While the use of $R_4$ and $R_5$ to achieve higher feedback voltages reduces transistor heating, it increases base drive dissipation. A compromise must therefore be struck between feedback voltage and the ratio of $R_2$ to $R_4$, $R_5$ to optimize the circuit.

$C_2$ and $R_6$, in combination, reduce voltage overshoot at the end of the winding opposite the clamped end. That is, while clamping one end of a winding ideally fixes the voltage at the other end, even with bifilar winding techniques the end opposite the clamp overshoots, resulting in damped oscillations, which endangers the cut-off transistor. The low resistance primary shunt $R_6$ avoids this. Taken alone, the dissipation required of $R_6$ would be impractical. However, $R_6$ is required only during transition and for a short period thereafter. Consequently, by employing the shunt resistor $R_6$ in series with the capacitor $C_2$, with component values selected for a discharge time of only a few hundred nanoseconds, dissipation through $R_6$ is small even for a low resistance value.

The discrete diode clamps $D_5$, $D_6$ are optional in the sense that if $Q_1$, $Q_2$ are darlingtons, MOSFETS, etc., these diodes would be integral with the power devices. The only difference would be that the clamping current would flow through the resistor $R_3$. Even if $D_5$, $D_6$ are omitted from the circuit of FIG. 3, the circuit would still function, as the collector-base junction of each transistor will reverse, acting as a forward biased diode, thereby forcing the emitter-base junction to avalanche breakdown. In practice, this would result in significant transistor heating, which is undesirable in terms of reliability, especially in compact systems operating at elevated temperatures. Consequently, in practice, $D_5$, $D_6$ are desirable and preferred in the circuit of FIG. 3, as the forward voltage of the diodes $D_5$, $D_6$ is small compared to the base-emitter voltage drop at avalanche, with the consequence that the clamping current produces far less heating which, in any event, is external to the transistors. While additional heat will be primarily dissipated in the transformer, conventional transformer constructions can sustain elevated temperatures without degradation.

The diodes $D_7$ and $D_8$ are included to ensure that the transistors $Q_1$, $Q_2$ operate reliably up to $V_{CBO}$. Normally, bipolar transistors, unlike MOSFETS, are subject to forward bias secondary breakdown, the issue being most critical as the base to emitter voltage ($V_{BE}$) crosses zero. Therefore, even with low base drive impedance, the collector to emitter voltage ($V_{CE}$) should be limited to $V_{CEO}$. Adding the diodes $D_7$ and $D_8$ permits the transistors $Q_1$ and $Q_2$ to operate reliably up to $V_{CBO}$. This is a significant economic advantage in terms of price/performance ratio. The heat, complexity and costs penalties of adding $D_7$ and $D_8$ are particularly justified in high voltage circuits. In low voltage circuits, the extra voltage drop of $D_7$ and $D_8$ is unacceptable, but in such circuits limiting the collector to emitter voltage to $V_{CEO}$ is generally adequate. It should also be recognized that adding $D_7$ and $D_8$ increases the starting voltage required of B+. If this is a factor, the resistors $R_8$ and $R_9$ can produce almost equivalent results at negligible cost and dissipation. The values for $R_8$ and $R_9$ are determined by the construction of transistors $Q_1$ and $Q_2$, and should be experimentally confirmed. If diodes $D_7$ and $D_8$ are included then an additional diode $D_{4A}$ may be added to compensate for the forward voltage drops of diodes $D_7$, $D_8$.

While the description given in connection with FIG. 3 assumes NPN transistors (or N channel MOSFETS) because of their generally better availability and/or higher cost/performance ratios, it will be apparent to those of ordinary skill in the art that all polarities could be reversed and PNP transistors or P-channel MOSFETS substituted.

In many applications of the circuit of FIG. 3, the load impedance at start-up is very low. Typical examples include a capacitor input filter, after rectification, in a power supply, or a tungsten lamp load, due to low cold filament resistance, in lighting applications. Initially, the capacitor $C_3$ acts as a short-circuit across the diode $D_4$. Consequently, the initial threshold current for oscillator reversal approaches zero, i.e. the voltage drop across the diodes $D_2$ and $D_3$ is approximately equal to the base to emitter voltages for their respective transistors $Q_1$, $Q_2$. The capacitor $C_3$ is large enough such that the time constant for $C_3 \times R_2 + R_4$) or [$R_5$] is several cycles long. Consequently, residual core magnetization and transient starting effects are dealt with on a progressive "soft start" basis. $R_7$ is included to discharge $C_3$ prior to re-start.

In addition to "soft start" considerations, a circuit must also be capable of properly starting into a overload. Taking the example of a tungsten lamp load, a low impedance secondary load reflects as a large reflected primary step current (See FIG. 4). As a result, there is little if any "clearance" between the reflected load current and the clamp limit. Reversal therefore occurs much earlier than it would if the design center load were attached. Stated otherwise, the lower the load impedance, the higher the switching frequency. The increase in switching frequency is, of course, limited in that the reflected load current can never exceed the primary current limit. As the lamp filament temperature and resistance increases, the load impedance rises, the reflected load current falls, and more time is available for current to reach the current limit, as the current amplitude is a function of time according to $I = I_{L(reflected)} + E\,dt/L$. Consequently, load current, which was initially fixed, remains fixed while load voltage rises to operating voltage, after which the load voltage remains essentially constant (except for internal regulation characteristics of the oscillator) as load current falls toward operating value. This process is controlled by the warm-up characteristics of the lamp filament versus the current limit and primary transformer inductance of the oscillator. For a reasonable ratio of current limit to reflected primary load current, and for a typical compact low voltage halogen lamp load, warm-up takes several hundred milliseconds. In this description, it is assumed that $C_3$ charges to the voltage across $D_4$ more quickly then filament warm-up, which is typical in real devices. It also assumes that initial load voltage is far less than rated voltage, which is true if initial load resistance is far below operating resistance, as it is for tungsten halogen lamps.

Therefore, during warm-up, the oscillator frequency is decreasing from an initial to a final value, and load power is rising to a maximum at voltage/current crossover, after which it declines to a final value. The lamp is therefore being "soft started" over time period much longer than the internal "soft start" that is an inherent characteristic of the oscillator itself. Also, the transistors are operated current limited during start up, even through power peaks at voltage/current crossover. It will accordingly be apparent that the system is very gentle to the transistors as compared with systems which hard-start at initial overloads, and is also very easy on the load, i.e. the lamp, by limiting the initial inrush to a low value. As a result, both transistor reliability and lamp starting life should be improved.

The loss of the secondary load simply removes the reflected load current component across from the voltage across $R_3$. Consequently, the current ($=E\,dt/L$) will rise to the current limit prior to reversal, and this will take longer than would be required if a reflected load current component were present. Therefore, the operating frequency will drop to a lower value, which is essentially a continuation of the "frequency downsweep" which occurs during filament warm-up. Since peak current remains substantially fixed, system loss drops only a bit due to the lower operating frequency, the temperature remains stable, i.e. there is no thermal runaway, and multiple rapid load disconnects due to intermittent lamp or socket connections, arcing at lamp burn out, etc., have little impact on oscillator reliability.

Table 1 below shows typical component values and identifications for the circuit of FIG. 3 where the oscillator is line-powered for use in a low voltage lighting application:

TABLE 1

| | |
|---|---|
| $R_1$ | 47,000 ohm, ½ watt |
| $R_2$ | 12 ohm, ½ watt |
| $R_3$ | 0.51 ohm, ½ watt |
| $R_4$ | 10 ohm, ½ watt |
| $R_5$ | 10 ohm, ½ watt |
| $R_6$ | 47 ohm, ½ watt |
| $R_7$ | 100 ohm, ¼ watt |
| $R_8$ | 100 ohm, ¼ watt |
| $R_9$ | 100 ohm, ¼ watt |
| $D_1$ | 1N4933 |
| $D_2$ | 1N4933 |
| $D_3$ | 1N4933 |
| $D_4$ | 1N4001 |
| $D_{4A}$ | 1N4001 |
| $D_5$ | 1N4936 |
| $D_6$ | 1N4936 |
| $D_7$ | 1N4933 |
| $D_8$ | 1N4933 |
| $C_1$ | 0.47 mfd, 250 Volt |
| $C_{1A}$ | 0.47 mfd, 250 Volt |
| $C_2$ | 0.01 mfd, 600 Volt |
| $C_3$ | 50 mfd, 6 Volt |
| $Q_1$ | MJE 13007 |
| $Q_2$ | MJE 13007 |
| Transformer | ⅜ × ⅜ Ferrite; 5 mil gap; Fairite type 77; primary coil = 115-0-115 turns; secondary coil = 12 turns; feedback coil = 4-0-4 turns. |

As noted above, the disclosed use of a common emitter resistor and of diode base clamps to avoid core saturation can also be employed in connection with MOSFETS. One such circuit, identified by reference numeral 200, is shown in FIG. 5 wherein 212 designates the primary winding, 214 the feedback winding, and 216 the secondary winding of the transformer.

Figure 5:
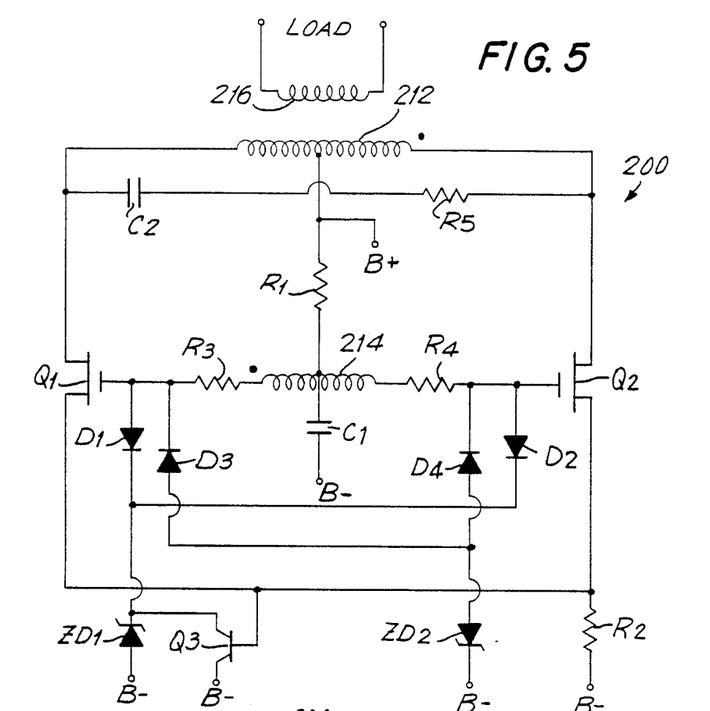
FIG. 5 is another self-excited push-pull oscillator circuit in accordance with the present invention.

Current sensing in the circuit of FIG. 5 is achieved by the common source resistor $R_2$. When the voltage at $R_2$ reaches a level predetermined by the value of $R_2$, transistor $Q_3$ conducts and acts to clamp the gate of the conducting MOSFET $Q_1$ or $Q_2$ through the diodes $D_1$, $D_2$, respectively. Resistor $R_1$ furnishes a self-starting voltage, and $R_3$ and $R_4$ are small enough that EIT heating is reasonable, but not so small that dissipation in the Zener diodes $Z_{D1}$ and $Z_{D2}$ becomes excessive or the current demands on $Q_3$ impractical.

Zener diode $Z_{D1}$, acting through $D_1$, $D_2$, protects the gate oxide. Similarly, $Z_{D2}$ protects the gate oxide through $D_3$, $D_4$. Together, these Zener diodes effectively anchor the feedback winding relative to B—. If $V_{ZD2}$ is larger than $V_{ZD1}$, the center tap of the feedback winding 214 will be negative with respect to B— during each half cycle. Even if $Z_{D1}$ and $Z_{D2}$ are identical, the voltage at the center tap will be approximately zero, assuming the resistance of $R_1$ is much larger than $R_3$ or $R_4$, and this is below threshold for enhancement mode power MOSFETS. The capacitor $C_1$ serves the same function that $C_1$ does in FIG. 3, and capacitor $C_2$ and resistor $R_5$ provide the "snubber" action of $C_2$ and $R_6$ in the oscillator of FIG. 3. In FIG. 5, the shunt diodes $D_5$ and $D_6$ are not shown, as they are integral with $Q_1$ and $Q_2$, respectively.

Table 2 below shows suitable component values and identifications for the circuit of FIG. 5, again as used in a line-powered, low voltage lighting application:

TABLE 2

| | |
|---|---|
| $R_1$ | 47,000 ohm, ½ watt |
| $R_2$ | 0.51 ohm, ½ watt |
| $R_3$ | 220 ohm, ½ watt |
| $R_4$ | 220 ohm, ½ watt |
| $R_5$ | 47 ohm, ½ watt |
| $C_1$ | 0.47 mfd, 50 Volt |
| $C_2$ | 0.01 mfd, 600 Volt |
| $D_1$ | 1N4933 |
| $D_2$ | 1N4933 |
| $D_3$ | 1N4933 |
| $D_4$ | 1N4933 |
| $Q_1$ | MTP 5N40 |
| $Q_2$ | MTP 5N40 |
| $Q_3$ | P/N 3569 |
| $Z_{D1}$ | 1N4742 |
| $Z_{D2}$ | 1N4733 |
| Transformer | ⅜ × ⅜ Ferrite; 5 mil gap; Fairite type 77; primary coil = 115-0-115 turns; secondary coil = 12 turns; feedback coil = 4-0-4 turns. |

Once having read this description, those of ordinary skill in the art will recognize that the particular circuit of FIG. 5 is not the only way to implement resistor current sensed switching in MOSFET oscillators, just as FIG. 3 is not the only way to implement the scheme for bipolar oscillator circuits. By way of example, the transistor $Q_3$ in FIG. 5 could be employed in place of $D_4$ in FIG. 3. Indeed, the technique is readily applicable to oscillator circuits other than the bipolar and MOSFET self-excited push-pull oscillators described above in connection with FIGS. 3-5. For example, the technique is applicable to "flyback" circuits common in lighting applications, such a bipolar "flyback" being shown and generally designated as 300 in FIG. 6. The circuit 300 includes the usual transformer having a primary winding 312, a feedback winding 314 and a secondary winding 316, and a single bipolar transistor $Q_1$. Since the circuit 300 employs only a single bipolar device, it will be apparent that only core saturation is at issue, and that current balance and core walk are not.

Figure 6:
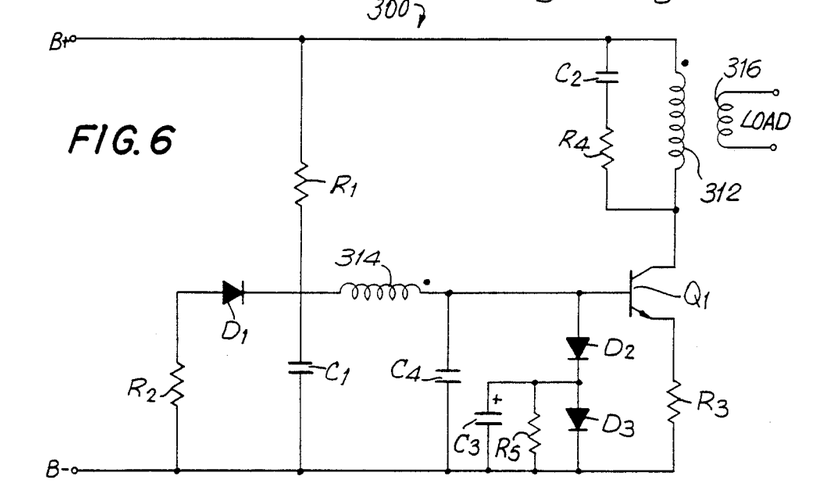
FIG. 6 is a flyback oscillator circuit in accordance with the present invention.

In FIG. 6, the diodes $D_2$ and $D_3$ initiate current rise termination, i.e. base clamping, at a level determined by the value of resistor $R_3$, much in the manner of the circuit 100 of FIG. 3 wherein $D_2$ and $D_3$ in combination with $D_4$ initiate current rise termination based on the value of $R_3$. The resistor $R_1$ provides oscillator self-starting and diode $D_1$ isolates the bias resistor $R_2$ during the "off" period to limit dissipation and also for isolating $R_2$ from $R_1$ as $D_1$ does in the oscillator of FIG. 3. $C_2$ and $R_4$ function, as do $C_2$ and $R_6$ in the FIG. 3 circuit, to reduce transformer ringing. Similarly, $C_3$ and $R_5$ "soft-start" the oscillator as do $C_3$ and $R_7$ in FIG. 3.

Table 3 below shows suitable component values and identifications for the circuit of FIG. 6, assuming a typical application where B+ is 6 Volts DC and the load is a fluorescent lamp (i.e., a typical emergency lighting application):

TABLE 3

| | |
|---|---|
| $R_1$ | 2200 ohm, ¼ watt |
| $R_2$ | 47 ohm, ¼ watt |
| $R_3$ | 0.39 ohm, ¼ watt |
| $R_4$ | 10 ohm, ¼ watt |
| $R_5$ | 100 ohm, ¼ watt |
| $C_1$ | 0.02 mfd, 50 Volt |
| $C_2$ | 0.047 mfd, 100 Volt |
| $C_3$ | 50 mfd, 6 Volt |
| $C_4$ | 0.02 mfd, 50 Volt |
| $D_1$ | 1N4933 |
| $D_2$ | 1N4933 |
| $D_3$ | 1N4001 |
| $Q_1$ | MJE 3055T |
| Transformer | ⅜ × ⅜ Ferrite; 5 mil gap; Fairite type 77; primary coil = 20 turns; secondary coil = 300 turns; feedback coil = 20 turns. |

Figure 7:
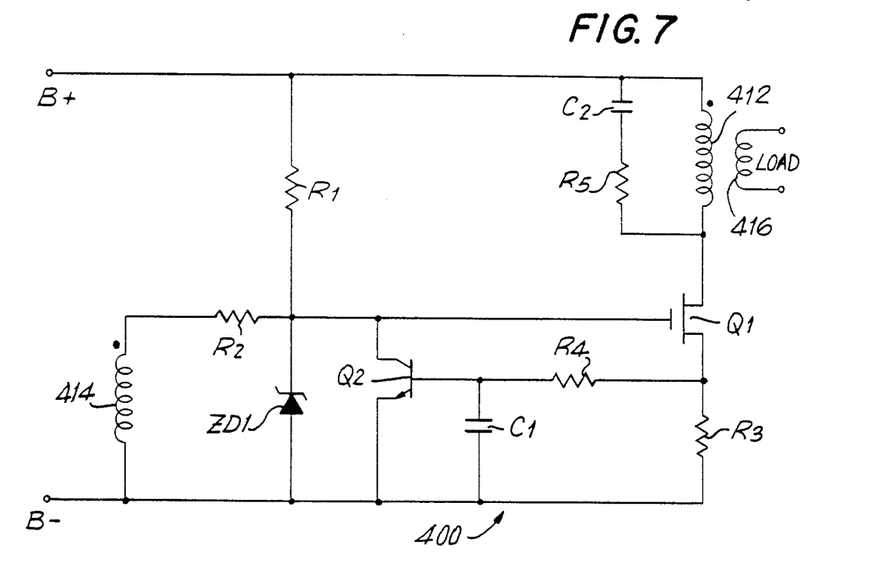
FIG. 7 is another flyback oscillator circuit in accordance with the present invention.

Referring now to FIG. 7, a similar technique may be employed in a MOSFET flyback. In the circuit 400 of FIG. 7, wherein 412, 414 and 416 designate the usual primary, feedback and secondary windings of the transformer, respectively, the source resistor $R_3$ provides current sensing and $Q_2$ functions as a gate clamp to initiate current rise termination. Again, $R_1$ provides self-starting and $Z_{D1}$ provides gate voltage protection in both the forward and reverse directions. $R_2$ limits current and dissipation in $Z_{D1}$ and $Q_2$, but must be sufficiently small to provide an acceptable time constant, in combination with the static and dynamic input capacitance of the MOSFET, to make EIT heating acceptable. Also, $R_1$ must be small enough to raise the gate voltage of $Q_2$ above threshold for self-starting without excessive dissipation.

Recognizing that switching times in MOSFETS can be quite short and gate power low, resistor $R_4$ and capacitor $C_1$ are employed as a "glitch filter" to add stability, the extra delay introduced by these components being compensated for by slightly raising the component value of source resistor $R_3$.

Suitable component values and identifications for the circuit of FIG. 7 are listed in Table 4 below, assuming a typical application where B+ is 6 Volts DC and the load is a fluorescent lamp (i.e., a typical emergency lighting application):

TABLE 4

| | |
|---|---|
| $R_1$ | 1200 ohm, ½ watt |
| $R_2$ | 1200 oh, ¼ watt |
| $R_3$ | 0.51 ohm, ¼ watt |
| $R_4$ | 47 ohm, ¼ watt |
| $R_5$ | 10 ohm, ½ watt |
| $C_1$ | 0.047 mfd, 50 Volt |
| $C_2$ | 0.047 mfd, 100 Volt |
| $ZD_1$ | 1N4740 |
| $Q_1$ | RFP 15N06L |
| $Q_2$ | P/N 3569 |
| Transformer | ⅜ × ⅜ Ferrite; 5 mil gap; Fairite type 77; primary coil = 15 turns; secondary coil = 300 turns; feedback coil = 20 turns. |

Figure 8:
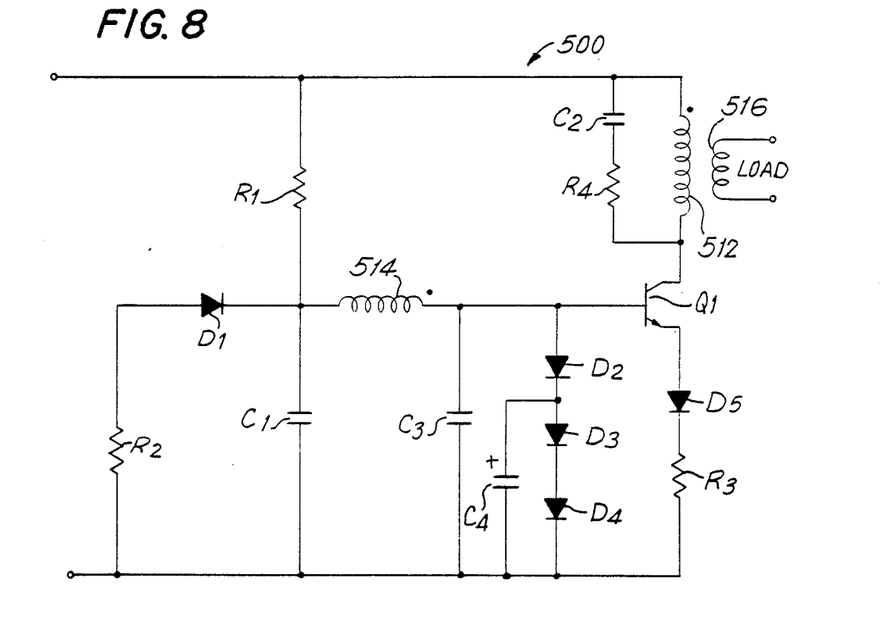
FIG. 8 is still another flyback oscillator circuit in accordance with the present invention.

Referring now to FIG. 8, still another flyback circuit in accordance with the present invention is generally designated at 500. The circuit of FIG. 8 is substantially similar to the circuit 300 of FIG. 6, except that the circuit 500 incorporates an emitter diode $D_5$ to accomplish emitter isolation. This is desirable in flyback circuits which operate at relatively high collector voltages even when the supply voltage is relatively low such, for example, as in lighting applications where the ignition voltage for gas discharge lamps is generally much higher than operating voltage.

The circuit of FIG. 8 incorporates essentially the same clamping scheme as the circuit of FIG. 6, i.e. diodes $D_2$ and $D_3$ in combination with emitter resistor $R_3$ to provide a base current clamp which initiates reversal before core saturation. The diode $D_4$ is added in series with the diodes $D_1$ and $D_2$ to compensate for the voltage drop of the added emitter diode $D_5$. The other circuit components serve the corresponding functions described above in connection with the other embodiments herein disclosed. Suitable component values and identifications for the circuit of FIG. 8 are listed below in Table 5.

TABLE 5

| | |
|---|---|
| $D_1$ | 1N4933 |
| $D_2$ | 1N4933 |
| $D_3$ | 1N4001 |
| $D_4$ | 1N4001 |
| $D_5$ | 1N4933 |
| $R_1$ | 2200 ohm, ¼ watt |
| $R_2$ | 47 ohm, ¼ watt |
| $R_3$ | 0.39 ohm, ¼ watt |
| $R_4$ | 10 ohm, ¼ watt |
| $C_1$ | 0.02 mfd, 50 Volt |
| $C_2$ | 0.047 mfd, 100 Volt |
| $C_3$ | 0.02 mfd, 50 Volt |
| $C_4$ | 50 mfd, 6 Volt |
| $Q_1$ | MJE 3055T |
| Transformer | ⅜ × ⅜ Ferrite; 5 mil gap; Fairite type 77; primary coil = 20 turns; secondary coil = 300 turns; feedback coil = 20 turns. |

While the foregoing describes the presently preferred embodiments of the present invention and suggests various modifications thereto, it will be apparent to those of ordinary skill in the art that still further changes and modifications may be made therein without departing from the spirit and scope of the invention. Accordingly, the above description should be construed as illustrative and not in a limiting sense, the scope of the invention being defined by the claims appended hereto In some of the following claims, for the sake of simplicity, certain semiconductor devices are described as having a base, a collector and an emitter, terminology commonly applied to bipolar transistors. However, as will be apparent to those of ordinary skill in the art, and as the above description demonstrates, the present invention may be employed with a wide range of semiconductor switching and junction devices, including by way of example MOSFETS, darlingtons, etc. In the case of MOSFETS, for example, the terms gate, source and drain are commonly employed instead of base, emitter and collector. Accordingly, in the following claims, whenever the terms base, collector and emitter are employed, they should be read as including the equivalent terminology for other semiconductor devices, and accordingly the claims should not be construed as limited to bipolar transistors.

I claim:

1. An oscillator circuit adapted for connection to a power source for producing an oscillating signal for driving a load, comprising:

a transformer having a core and primary, secondary and feedback windings on said core, the secondary winding being adapted for connection across the load whereby the signal produced in the secondary drives the load;

a first semiconductor junction device of the type having a base, a collector, and an emitter, the base being connected to one end of the feedback winding and the collector being connected to one end of the primary winding, the first semiconductor junction device being alternately driven between saturation and cut-off for producing an oscillating current across said primary winding when the circuit is connected to the power source;

a second semiconductor junction device of the type accommodating current flow in only one direction upon the application of at least a predetermined threshold voltage, said second semiconductor device being connected in parallel with the base-emitter junction of said first semiconductor device whereby current is shunted from said base through said second semiconductor device for initiating cut-off of said first semiconductor device when the voltage at said base raises the voltage across the second semiconductor device to said threshold voltage; and first resistor means connected in series with the emitter of said first semiconductor device such that the voltage at the base of said first semiconductor device is a function of emitter current, the value of said resistor means being preselected to raise the base voltage for initiating current flow through said second semiconductor device before the current flow through said first semiconductor device drives the transformer to saturation.

2. The circuit according to claim 1, further comprising:

a third semiconductor junction device of the type including a base, collector and emitter, the base of said third semiconductor device being connected to a second the other end of said feedback winding, and the collector of said third semiconductor device being connected to a second end of said primary winding, said circuit being connectable to said power source by applying said power source across the center taps of said primary and feedback windings;

a fourth semiconductor junction device of the type accommodating current flow in only one direction upon the application of at least a predetermined threshold voltage, said fourth semiconductor device being connected in parallel with the base-emitter junction of said third semiconductor device whereby current is shunted from the base thereof through said fourth semiconductor device for initiating cut-off of said third semiconductor device when the voltage at the base thereof raises the voltage across the fourth semiconductor device to its threshold voltage; and said first resistor means also being connected in series with the emitter of said third semiconductor junction device such that the voltage at the base of said third semiconductor device is a function of its emitter current, whereby the base voltage of the conducting on of said first and third semiconductor devices increases sufficiently to initiate current flow through the respective second or fourth semiconductor device before the transformer core saturates.

3. The circuit according to claim 2, further comprising a fifth semiconductor junction device of the type accommodating current flow in only one direction upon the application of at least a predetermined threshold voltage, said fifth semiconductor device being connected in series with said second and fourth semiconductor devices, whereby current is shunted from the base of said first semiconductor device when the voltage at the base thereof raises the voltage across the second and fifth semiconductor devices above their combined thresholds, and current is shunted from the base of said third semiconductor device when the voltage at the base thereof raises the voltage across the fourth and fifth semiconductor devices above their combined thresholds.

4. The circuit according to claim 3, further comprising first capacitor means in parallel with said fifth semiconductor device for providing substantially a short circuit thereacross at start-up.

5. The circuit according to claim 4, further comprising second resistor means in parallel with said first capacitor means for discharging said first capacitor means prior to start-up.

6. The circuit according to claim 3, wherein said fifth semiconductor device comprises the collector-emitter junction of a transistor, and wherein the base-emitter junction thereof is in parallel with said first resistance means.

7. The circuit according to claim 2, further comprising first capacitor means connected at one end to a center tap of said feedback winding and at its other end to said power source for preventing said first and third semiconductor devices from conducting simultaneously at oscillator reversal.

8. The circuit according to claim 2, further comprising a capacitor connected at one end to a center tap of said primary winding and at its other end to a center tap of said secondary winding for preventing said first and third semiconductor devices from conducting simultaneously at oscillator reversal.

9. The circuit according to claim 3, wherein said first and third semiconductor devices are bipolar transistors and said second and fourth semiconductor devices are diodes.

10. The circuit according to claim 3, wherein said first and third semiconductor devices are MOSFETS and said second and fourth semiconductor devices are diodes.

11. The circuit according to claim 1, further comprising a third semiconductor device of the type accommodating current flow in only one direction upon the application of a predetermined threshold voltage, said third semiconductor device being connected in series with said second semiconductor device.

12. The circuit according to claim 11, further comprising first capacitor means in parallel with said third semiconductor device for providing substantially a short circuit thereacross at start-up.

13. The circuit according to claim 12, further comprising second resistor means in parallel with said first capacitor means for discharging said first capacitor means prior to start-up.

14. The circuit according to claim 11, wherein said third semiconductor device comprises the collector-emitter junction of a transistor, and wherein the base-emitter junction thereof is in parallel with said first resistance means.

15. The circuit according to claim 1, wherein said first semiconductor device is a bipolar transistor and said second semiconductor device is a diode.

16. The circuit according to claim 1, wherein said first semiconductor device is a MOSFET and said second semiconductor device is a transistor.

17. The circuit according to claim 1, said circuit being connected to a power source by applying the power source between a center tap of said primary winding and an end of said first resistor means remote from said emitter of the first semiconductor device.

18. An improved oscillator for connection to a power supply for supplying a periodic signal to a load, comprising:
transformer means having a core and primary, secondary and feedback windings on said core, said secondary winding being adapted for connection to the load for delivering the periodic signal to the load;
switching means having a current path therethrough and a control electrode for controlling current flow through said current path, said control electrode being connected to said feedback coil and said current path being connected to said primary coil, said switching means being alternatively driven between conductive and substantially nonconductive conditions of current flow through said current path to generate the periodic signal in said primary winding;
diode means connected between said control electrode and the power source for initiating switching of said switching means from said conductive to said nonconductive condition by shunting current from said control electrode through said diode means when the voltage at said control electrode rises to a predetermined diode means threshold voltage; and
resistor means in series connection with said current path for predetermining the point at which said switching means switches from said conductive to said nonconductive condition by limiting current flow through said current path and the corresponding increase in voltage at said control electrode during conduction of s id switching means so that the voltage at said control electrode rises to said predetermined threshold voltage and said switching means switches from said conductive to said nonconductive condition prior to saturation of said transformer means core.

19. An improved oscillator in accordance with claim 18, wherein said switching means comprises first and second switching means which are alternately driven between alternating conductive and nonconductive conditions, each of said first and second switching means having a current path therethrough and a control electrode.

20. An improved oscillator in accordance with claim 19, wherein said diode means comprises first diode means connected between the control electrode of said first switching means and the power source and second diode means connected between the control electrode of said second switching means and the power source.

21. An improved oscillator in accordance with claim 19, said primary coil of said transformer means being connected in series connection with the current paths of said first and second switching means.

22. An improved oscillator in accordance with claim 19, wherein said feedback coil is connected between said control electrodes of said first and second switching means.

23. An improved oscillator in accordance with claim 21, wherein said feedback coil is connected between said control electrodes of said first and second switching means.

24. An improved oscillator in accordance with claim 18, wherein said switching means comprises semiconductor switching means.

25. An improved oscillator in accordance with claim 18, wherein said switching means comprises a bipolar transistor, said current path includes an emitter and a collector of said transistor, said control electrode comprises a base of said transistor, and said resistor means is connected in series connection with said emitter of the transistor.

26. An improved oscillator in accordance with claim 19, wherein each of said first and second switching means comprises a bipolar transistor and wherein the current path of each said transistor includes an emitter and a collector, the control electrode of each said transistor comprises a base, and said resistor means is connected in series with said emitters of said transistors.

27. An improved oscillator in accordance with claim 19, wherein said primary coil includes a centertap, and said power source being connected between said primary coil centertap and a end of said resistor means remote from said switching means.

* * * * *